(12) United States Patent
Chung et al.

(10) Patent No.: US 8,927,090 B2
(45) Date of Patent: Jan. 6, 2015

(54) METHOD FOR BONDING BODIES AND COMPOSITE BODY

(75) Inventors: Hin Yiu Anthony Chung, Ulm (DE); Dirk Schaffer, Jena (DE)

(73) Assignee: Carl Zeiss SMT GmbH, Oberkochen (DE)

(*) Notice: Subject to any disclaimer, the term of this patent is extended or adjusted under 35 U.S.C. 154(b) by 50 days.

(21) Appl. No.: 13/248,987

(22) Filed: Sep. 29, 2011

(65) Prior Publication Data

US 2012/0082823 A1    Apr. 5, 2012

Related U.S. Application Data

(60) Provisional application No. 61/387,570, filed on Sep. 29, 2010.

(30) Foreign Application Priority Data

Sep. 29, 2010    (DE) .......................... 10 2010 041 576

(51) Int. Cl.
| | | |
|---|---|---|
| B32B 3/00 | (2006.01) | |
| B32B 3/02 | (2006.01) | |
| B32B 3/22 | (2006.01) | |
| C09J 5/00 | (2006.01) | |
| B29C 63/02 | (2006.01) | |
| G03F 7/20 | (2006.01) | |
| B29C 63/48 | (2006.01) | |
| F16B 11/00 | (2006.01) | |

(52) U.S. Cl.
CPC . *C09J 5/00* (2013.01); *B29C 63/02* (2013.01); *G03F 7/70716* (2013.01); *G03F 7/7095* (2013.01); *B29C 2063/485* (2013.01); *C09J 2463/00* (2013.01); *F16B 11/006* (2013.01)
USPC ............ 428/189; 428/220; 428/192; 355/53; 355/72; 355/75; 403/265; 403/268

(58) Field of Classification Search
USPC ................ 428/189, 325, 192; 355/53, 72, 75; 403/265, 268; 156/278
See application file for complete search history.

(56) References Cited

U.S. PATENT DOCUMENTS 3,545,795 A * 12/1970 Hertel et al. ................... 403/265
4,332,636 A     6/1982 McLeod
(Continued)

FOREIGN PATENT DOCUMENTS

CN    1422927 A    6/2003
DE    2130773      4/1972
(Continued)

OTHER PUBLICATIONS

Evidentiary reference "Cordierite".*

(Continued)

*Primary Examiner* — Maria Veronica Ewald
*Assistant Examiner* — Joanna Pleszczynska
(74) *Attorney, Agent, or Firm* — Edell, Shapiro & Finnan, LLC (57) ABSTRACT

A method for bonding a first body (2) to a second, panel-shaped body (3) at bonding surfaces (2a, 3a) lying opposite each other, the second body (3) projecting in at least one direction (X) beyond an edge (2') of the first body (2). The method includes: producing a plurality of spacers (4a to 4e, 4a' to 4e') on at least one of the bonding surfaces (2a), applying adhesive (5) into intermediate spaces (6a to 6d) between the spacers beyond an outer spacer (4e, 4e') as far as an adhesive periphery (5a), which is formed at an edge (2') of the first body (2), and bonding the bodies (2, 3) by bringing the bonding surfaces (2a, 3a) into contact at the spacers (4a' to 4e'). A prescribed distance (d) between the adhesive periphery (5a) and the outermost spacer (4e) is set to provide a desired state of deformation of the panel-shaped body (3) after a shrinkage of the applied adhesive (5) (e.g. minimized bending of the body.) In an associated composite body (1), the prescribed distance (d) lies between 20 μm and 250 μm, preferably between 30 μm and 200 μm, in particular between 40 μm and 150 μm.

11 Claims, 5 Drawing Sheets

(56) References Cited

U.S. PATENT DOCUMENTS

| | | | |
|---|---|---|---|
| 5,783,298 A * | 7/1998 | Herring et al. ............ | 428/323 |
| 5,814,386 A | 9/1998 | Vasiliev et al. | |
| 6,099,193 A | 8/2000 | Hangleiter et al. | |
| 6,447,898 B1 * | 9/2002 | Pfaff ............................. | 428/346 |
| 6,519,394 B2 | 2/2003 | Kondo et al. | |
| 6,640,032 B2 | 10/2003 | Kondo et al. | |
| 2002/0040751 A1 * | 4/2002 | Hilton et al. ................. | 156/64 |
| 2003/0109624 A1 | 6/2003 | Shah | |
| 2003/0234989 A1 * | 12/2003 | Oshino et al. ............... | 359/811 |
| 2006/0192328 A1 | 8/2006 | Morrison et al. | |

FOREIGN PATENT DOCUMENTS

| | | |
|---|---|---|
| DE | 2311748 | 9/1973 |
| DE | 3829248 A1 | 3/1989 |
| DE | 20002827 U1 | 6/2000 |
| DE | 10121086 A1 | 12/2002 |
| DE | 102004015013 A1 | 10/2005 |
| JP | S62-118323 A | 5/1987 |
| JP | S63-18537 A | 1/1988 |
| JP | H02-129000 A | 5/1990 |
| JP | 2004-312666 A | 11/2004 |
| JP | 2007-194320 A | 8/2007 |
| JP | 2007-297582 A | 11/2007 |
| JP | 2007-329475 A | 12/2007 |
| JP | 2010-015753 A | 1/2010 |

OTHER PUBLICATIONS

Evidentiary reference "Properties of Silicon".*
Japanese Office Action for Japanese Patent Application 2011-212818 dated Oct. 1, 2013.
English translation of Chinese Office Action, dated Apr. 3, 2014, issued in Chinese counterpart Application No. 2011102938200.

* cited by examiner

METHOD FOR BONDING BODIES AND COMPOSITE BODY

CROSS REFERENCE TO RELATED APPLICATIONS

The present Application claims benefit of German Patent Application DE 10 2010 041 576.6, filed Sep. 29, 2010, as well as U.S. Provisional Application No. 61/387,570, also filed Sep. 29, 2010. The entire contents of both applications are hereby incorporated into the present application by reference.

BACKGROUND OF THE INVENTION

The invention relates to a method for bonding a first body to a second, panel-shaped body at bonding surfaces lying opposite each other. The second body projects in at least one direction beyond an edge of the first body. The invention also relates to a composite body, in particular a positioning table, comprising at least two bodies bonded by adhesive bonding.

In order to reduce the mass, and consequently the inertia, in the movement of positioning tables, for example of wafer stages or reticle stages for microlithography (also referred to hereafter as "stage" for short), said tables are produced from lightweight materials, such as for example Zerodur® or cordierite. To reduce the mass further, the positioning tables may be formed as composite bodies which are joined together from a number of bodies. To reduce the mass, cavities may be formed between the bodies and/or the walls of individual (part) bodies may be of a thin design. Fixtures such as end stops, motor holders, sensors or scales for the positioning, prisms, etc., may be adhesively incorporated or adhesively attached on these walls.

During the adhesive bonding of the bodies, there is the problem however that the adhesive that is used cures or, when the composite body is introduced into an appropriate environment (for example a nitrogen or vacuum environment), it dries out, as a result of which the adhesive undergoes shrinkage. As a result, deformations occur on the bodies, possibly causing bending, particularly when adhesively bonding thin, panel-shaped bodies. The panel-shaped bodies may be, for example, parts or walls of the main body of a positioning table, or else parts of fixtures bonded to said main body, for example thin, generally relatively long, sensor scales. The deformations caused by the shrinkage of the adhesive may sometimes lead to drastic errors in the overlay and possibly make the "stages" unusable for use in microlithography. One possible way of obviating this problem is to thicken the walls of the composite body, which however involves an increase in the mass, and consequently the inertia, of the composite body, which is intended to be avoided in the case of the present applications.

US 2006/0192328 A1 discloses joining together a bonded body from at least two bodies, of which at least one has an optical surface, along two contact surfaces lying opposite each other. Arranged in the region of at least one contact surface is at least one structure for isolating at least one of the bodies from deformations. A drop of adhesive in a recess in one of the bonding surfaces may serve as such structure, producing a tensile stress between the two bodies during curing. To avoid the tensile stresses producing a deformation of the body on which the optical surface is formed, slits may be provided there.

U.S. Pat. No. 6,099,193 describes a composite body which is joined together from at least two bodies of different materials. The bonded body is formed by opposing bonding surfaces of the bodies being wrung upon each other. Provided on at least one bonding surface is at least one recess for an adhesive location or an adhesive gap, an adhesive ensuring an additional adhesive bond of the two bonding surfaces at the adhesive bond between the two bodies.

U.S. Pat. No. 6,640,032 B2 describes a bonded structure with two optical components, in which the two optical components are mounted on the surface of a common substrate. At least one of the optical components is secured by a bonding surface on the common substrate, a cured and shrunk adhesive being used. Provided in the substrate is at least one groove, into which the adhesive is introduced, so that an alignment of the optical axes of the two components with a deviation of less than 1 µm can be achieved.

U.S. Pat. No. 6,519,394 B2 also describes a bonded structure which comprises two optical components which are mounted on a respective supporting body. The supporting bodies are attached to each other with the aid of a cured acrylic resin adhesive in such a way that an alignment of the optical axes of the two components with a deviation of less than 1 µm can be achieved. The viscosity of the adhesive before the curing is greater than 500 cP and less than 5000 cP.

U.S. Pat. No. 4,332,636 describes a method for bonding an optical element to a support using a thin pad of material of substantially the same extent as a base area of the optical element. The material of the pad is chosen such that the adhesive will not adhere there. A fillet of the adhesive is placed around the base of the optical element and is in contact with both the pad and with the optical element. In one embodiment, an aperture is introduced into the pad and filled with a rapid-setting adhesive to fix the optical element while the fillet of adhesive is applied.

OBJECTS AND SUMMARY OF THE INVENTION

One object of the invention is to develop a method for bonding bodies and a composite body of the type mentioned at the beginning in such a way that, after the shrinkage of the adhesive that is used, the panel-shaped body achieves a desired state of deformation in which in particular deformations that are caused by the shrinkage of the adhesive are reduced or minimized.

According to one aspect of the invention, this object is achieved by a method for bonding a first body to at least one second, panel-shaped body at bonding surfaces lying opposite each other, the second body projecting in at least one direction beyond an edge of the first body. The method comprises: producing a plurality of spacers on at least one of the bonding surfaces, applying adhesive into intermediate spaces between the spacers and beyond an outer spacer as far as an adhesive periphery, which is formed at an edge of the first body, and bonding the bodies by bringing the bonding surfaces into contact at the spacers, a prescribed distance (other than zero) between the adhesive periphery and the outer spacer being set to set a desired state of deformation of the panel-shaped body after a shrinkage of the applied adhesive, in which state particularly bending of the panel-shaped body is minimized.

The inventors have found that deformations, particularly bending, of thin, panel-shaped bodies during adhesive bonding can be reduced or minimized by the spacers being skilfully arranged in the adhesive between the bodies. Particularly relevant for the (positive or negative) bending of a thin body is the distance from the adhesive periphery at which the last spacer, neighboring the adhesive periphery, is positioned. If the last spacer is positioned too far away from the adhesive periphery, a bending in a first (positive) direction is obtained, whereas positioning of the last spacer too close to the adhesive periphery brings about a bending in the opposite (negative) direction. Given a suitable choice of the distance of the last spacer from the adhesive periphery, it can consequently be ensured that neither bending in the positive direction nor bending in the negative direction occurs, so that the deformations or the bending can be minimized. The adhesive periphery generally finishes flush here with an edge formed on the first (generally solid) body. A solid body is understood here as meaning a body of which the thickness is so great that no bending, or if anything only extremely slight bending, can occur on it during the shrinkage of the adhesive. It goes without saying that a deformation or bending of the panel-shaped body after the shrinking of the adhesive may also be desired, i.e. the desired state of the panel-shaped body may possibly also differ from a state in which the bending is minimized.

In one variant, the distance of the outermost spacer from the adhesive periphery is between 20 µm and 250 µm, preferably between 30 µm and 200 µm, in particular between 40 µm and 150 µm. It has been possible with the aid of simulations to show that distances that lie in this range of values bring about a minimal, or at least very greatly reduced, deformation of the panel-shaped body in the case of most conventional adhesives.

In a further variant, the spacers are arranged at distances from one another of over 0.3 mm, preferably of over 1 mm, in particular of over 5 mm. The distances between neighboring spacers and between the outermost spacer and the adhesive periphery are measured here on the basis of a supporting location which is generally provided centrally on the spacers and serves for supporting the respective spacer on an opposing bonding surface. It has proven to be favorable if the distance between the spacers is constant and relatively great. It goes without saying that this does not apply to the distance between the outermost spacer and the adhesive periphery, which as described above is fixed in dependence on the shrinkage of the adhesive.

In a further variant, a thickness of the panel-shaped body of 5 mm or less, preferably of 2 mm or less, in particular of 1 mm or less, is chosen. In the case of panel-shaped bodies that have a greater thickness, generally just very minor bending should be expected, so that a setting of the distance between the outermost spacer and the adhesive periphery may not be necessary in that case.

In a further variant, the quotient of the modulus of elasticity of the panel-shaped body and the modulus of elasticity of the adhesive lies between 5 and 300, preferably between 10 and 200. Such an order of magnitude of the quotient is typical, particularly for applications with wafer holders or wafer stages, in the case of which metallic materials are usually used as panel-shaped bodies.

Depending on the type of material that is used, the stiffness of the spacers may vary within a wide range between about 500 N/mm and about 10 million N/mm. For spacers in the form of glass beads with diameters of about 0.1 mm, the stiffness typically lies between about 5000 N/mm and about 10 000 N/mm.

In one variant, the shrinkage of the adhesive is between 0.1% and 5%, preferably between 2% and 4%, in particular between 2.5% and 3.5%. The shrinkage (in % by volume) of conventional adhesives during curing and/or drying out usually lies in this range of values. For example, the shrinkage of adhesives based on epoxy resin is generally about 3%.

In a further variant, the adhesive is selected from the group comprising: 2-component adhesives, in particular epoxy adhesives, and 1-component adhesives, in particular UV-curable adhesives. 2-Component adhesives are generally made up of resin (for example epoxy resin) and a hardener. Polymer modules which bear so-called epoxy groups at the end are used as epoxy resin. It goes without saying that other chemically hardered adhesives may possibly also be used. Alternatively, 1-component adhesives (for example based on acrylate), which cure to form solid polymers by radical polymerization triggered for example by UV radiation, may also be used. The choice of adhesive depends of course on the type of materials to be adhesively bonded. If the first body is a fixture, for example in the form of a motor holder or the like, its outer shell generally consists of a metal which is adhesively attached onto the "stage" material, for example cordierite or Zerodur®.

In a further variant, the adhesive has a dynamic viscosity of less than 5000 mPa s, preferably of less than 3000 mPa s, in particular of less than 2500 mPa s. This is favorable since the adhesive is intended to adhere between the spacers, but not on the spacers, in order that the two bodies lie directly one against the other in the region of the upper side of the spacers. It goes without saying that this may be required in particular whenever a greater amount of adhesive can adhere to the upper side of the spacers, which may possibly be the case with spacers which are produced by a microstructuring of the bonding surface.

In a further variant, the spacers are formed as fillers, which are arranged on the bonding surface by micropositioning, or the spacers are formed as projections, which are produced by microstructuring of the bonding surface. In the first case, the spacers may be formed for example as glass bodies, which are positioned on the bonding surface by automatic micropositioning with the aid of robots. In the second case, the bonding surface may be suitably pretreated, by the material in the intermediate spaces between the spacers being removed. The removal of material may be performed for example by etching away the surface of the body in the region of the bonding surface using an etching mask or in a mechanical way.

The spacers typically have a maximum width of less than 250 µm, preferably of less than 100 µm. The spacers may particularly be of a pyramidal or conical form, the maximum width of the spacers in this case being measured along their base side. The spacers may also be formed as fillers, in the form of beads, for example in the form of glass beads. In this case, the diameter of the beads determines the maximum width of the spacers.

In a further variant, the bodies to be bonded are formed as parts of a positioning table, in particular a wafer stage or a reticle (mask) stage for microlithography. As described above, a (solid) fixture may be attached to a wall in panel form of the positioning table, or a panel-like add-on part, for example in the form of a scale, may be attached to a (solid) part of the positioning table.

According to another aspect, a composite body is provided, comprising: a first body, a second, panel-shaped body, which projects in at least one direction beyond an edge of the first body, the first body and the second body being bonded to each other at bonding surfaces lying opposite each other with an adhesive, at least one of the bonding surfaces having a plurality of spacers and the adhesive being applied both into intermediate spaces between the spacers and beyond an outer spacer as far as an adhesive periphery, which is formed at an edge of the first body, a distance between the adhesive periphery and the outer spacer being between 20 µm and 250 µm, preferably between 30 µm and 200 µm, in particular between 40 µm and 150 µm, to set a desired state of deformation of the panel-shaped body after a shrinkage of the applied adhesive, in which state particularly bending of the panel-shaped body is minimized.

As described above, with a spacing of the spacer directly neighboring the adhesive periphery from the adhesive periphery within the specified range of values, a deformation or bending of the (panel-like) body is at least greatly reduced in the case of conventional adhesives and, given a suitable choice of the distance within this range of values (in dependence on the adhesive that is used), can be minimized, i.e. suppressed almost completely.

In one embodiment, the spacers are arranged at distances from one another of over 0.3 mm, preferably of over 1 mm, in particular of over 5 mm. The distances between neighboring spacers are typically chosen to be constant, but may possibly also vary within certain limits.

In a further embodiment, the panel-shaped body has a thickness of 5 mm or less, preferably of 2 mm or less, in particular of 1 mm or less. The thinner the panel-shaped body, the greater typically the bending caused by the shrinkage of the adhesive.

In one embodiment, the quotient of the modulus of elasticity of the panel-shaped body and the modulus of elasticity of the adhesive lies between 5 and 300, preferably between 10 and 200. With the adhesives that are typically used and materials that are usually used for the panel-shaped body, the quotient of the two moduli of elasticity lies in the range specified above.

In one embodiment, the spacers are formed by fillers, which are provided on the bonding surface. Glass bodies may be used for example as fillers.

Alternatively, the spacers may also be formed as projections in the microstructured bonding surface, it being possible for the microstructuring of the bonding surface to be created by removal of material, for example using a grinding robot or by etching.

In a development, the spacers, in particular the fillers or the projections, have a maximum width of less than 250 μm, preferably of less than 100 μm. Since the adhesive is applied only between the spacers but not to the contact surfaces of the spacers with the opposing bonding surface, the spacers generally should not exceed this maximum width. It goes without saying that the spacers may preferably be configured as convex, for example pyramidal or conical, bodies in order to obtain a contact region that is as small as possible, in particular punctiform, with the opposing bonding surface. It also goes without saying, however, that, when a highly viscous adhesive is used, the use of (almost) frustoconical or frustopyramidal spacers may also be possible, since the adhesive in this case generally does not adhere even on a (slightly) extended contact region.

In one embodiment, the adhesive has a shrinkage of between 0.1% and 5%, preferably between 2% and 4%, in particular between 2.5% and 3.5%. The shrinkage of the adhesive takes place during the curing, and possibly also during the drying out, for example when the composite body is introduced into a vacuum environment. It goes without saying that drying out of the adhesive, and accompanying shrinkage, may also possibly be caused by an increase in temperature.

In a further embodiment, the adhesive has a (dynamic) viscosity of less than 5000 mPa s, preferably of less than 3000 mPa s, in particular of less than 2500 mPa s. This can achieve the effect that the adhesive only remains between the spacers, but not on the spacers, so that the bonding surfaces can lie directly one against the other on supporting locations of the spacers that are typically the same height.

In one embodiment, the adhesive is selected from the group comprising: 2-component adhesives, in particular epoxy adhesives, and 1-component adhesives, in particular UV-curable adhesives. As described above, the choice of a suitable adhesive depends on the type of materials to be adhesively bonded.

In one embodiment, the bonding surface of one of the bodies is a planar surface. This may be brought into contact at supporting locations of the spacers (of the same height) of the other body in order to align the two bodies parallel to each other. It goes without saying that the spacers are generally of the same height, but this is not imperative, i.e. an increasing or decreasing height of the spacers may also be possible if the bodies are to be aligned at a specific angle in relation to each other.

In a further embodiment, the composite body is formed as a positioning table, in particular as a wafer stage or as a reticle stage for microlithography. It goes without saying that such a positioning table generally comprises more than two bodies, of which at least two are bonded to each other in the way described above. A deformation of thin, panel-shaped bodies (walls, scale parts, etc.) of the positioning table during the adhesive bonding can be avoided, or at least greatly reduced, in the way described above.

Further features and advantages of the invention emerge from the description which follows of exemplary embodiments of the invention, on the basis of the figures of the drawing, which show details related to the invention, and from the claims. The individual features may each be realized individually on their own or together in any desired combination in variants of the invention.

DRAWING

Exemplary embodiments are represented in the schematic drawing and are explained in the description which follows. In the drawing.

Figure 1A:
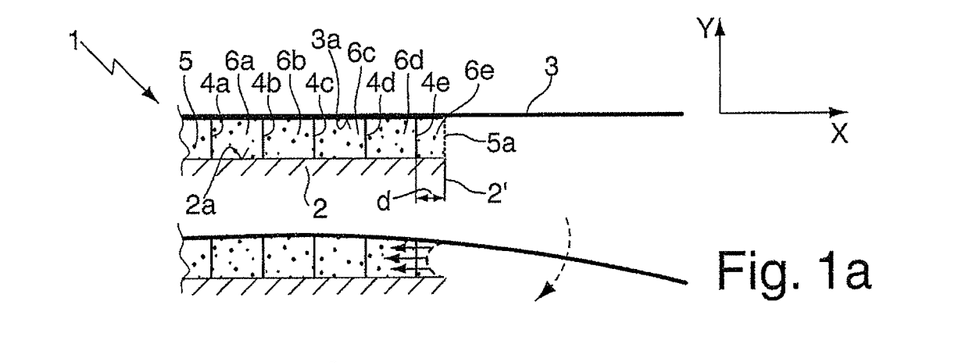
FIGS. 1*a,b* show schematic representations of a (negative or positive) bending of a panel-shaped body, which is bonded to a solid body by adhesive bonding.

Schematically shown in FIG. 1*a* is a detail of a composite body 1, which comprises a first, solid body 2 and a second, thin panel- or bar-shaped body 3. The panel-shaped body 3 projects here in a first direction X beyond an edge 2' of the solid body 2 and has a thickness of typically 5 mm or less. Provided on a bonding surface 2*a* of the solid body 2 are spacers 4*a*-4*e*, which may be formed as fillers, for example as glass bodies, and which have been positioned on the bonding surface 2*a*, for example using a robot. To simplify the representation, the spacers in FIG. 1a are represented as lines, although they may also have an extent in the first direction (X direction).

To bond the two bodies 2, 3, firstly adhesive 5 is applied into intermediate spaces 6a to 6d between the spacers 4a to 4e and into a region 6e, which reaches beyond an outer spacer 4e as far as an adhesive periphery 5a. The adhesive periphery 5a is formed here at the edge 2' of the first body 2. After that, a planar bonding surface 3a of the panel-like body 3 is placed onto the spacers 4a to 4e, so that it rests on the spacers 4a to 4e serving as supporting locations (of identical height), whereby the two bodies 2, 3 are aligned parallel to each other along their bonding surfaces 2a, 3a and fixed in their relative position in relation to each other.

In the case of the embodiment represented in FIG. 1a of the composite body 1, however, there is the problem that the volume of the adhesive 5 may be reduced, i.e. the adhesive 5 shrinks. This shrinking may be triggered for example by curing of the adhesive 5 or by introduction of the composite body 1 into an environment in which the adhesive 5 dries out (for example in a nitrogen or vacuum environment). When the adhesive 5 shrinks, the adhesive 5 also contracts in the region 6e at which the adhesive periphery 5a is formed, so that, after the shrinkage, said periphery has a concavely curved surface, as indicated at the bottom in FIG. 1a. The shrinking of the adhesive 5 has the effect that a stress or force is exerted on the panel-shaped body, with the result that said panel bends in the negative Y direction.

Figure 1B:
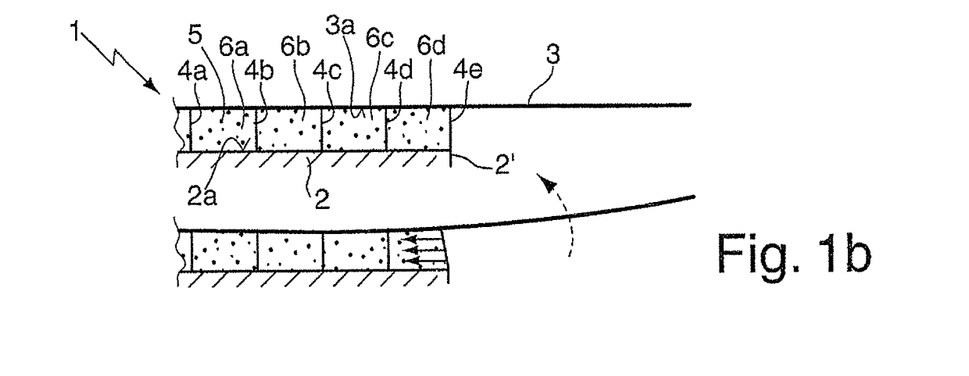

FIG. 1b shows a representation of the composite body 1 analogous to FIG. 1a, in which, by contrast with FIG. 1a, the outermost spacer 4e finishes flush with the edge 2' of the first body 2, i.e. the adhesive 5 has only been introduced into the intermediate spaces 6a to 6d between the spacers 4a to 4e and the outermost spacer 4e delimits the adhesion with respect to the surroundings. As represented at the bottom in FIG. 1b, shrinking of the adhesive 5 in this case has the result of exerting a force on the outermost spacer 4e that moves it away from the edge 2', whereby the panel-shaped body 3 bends in a positive Y direction.

Since, depending on the distance d (cf. FIG. 1a) between the adhesive periphery 5a and the outermost spacer 4e, the bending of the panel-shaped body 3 can take place both in the positive and in the negative Y direction, there is clearly a distance d of the outermost spacer 4e from the adhesive periphery 5a at which the bending in the Y direction is minimal (or in an ideal case zero).

Figure 2:
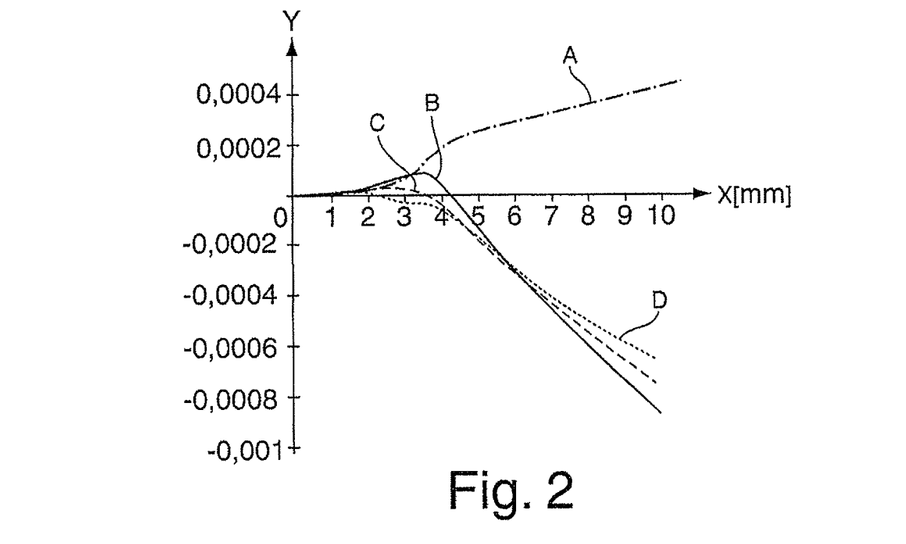
FIG. 2 shows a schematic representation of the deflection of the panel-shaped body from FIG. 1*a,b* with different distances of a spacer from an adhesive periphery.

This is also illustrated by FIG. 2, which shows the deflection of the projecting part of the panel-like body 3 in the Y direction in dependence on the X coordinate (in mm) from the adhesive periphery 2' for increasing distances X from the adhesive periphery 2'. In the case of a first deflection curve A, the outermost spacer 4e is arranged directly at the adhesive periphery 5a (d=0 mm), as represented in FIG. 1b, whereby a positive bending is obtained. Three further deflection curves B, C, D are shown for distances d of the spacer 4e from the adhesive periphery 5a of 0.5 mm, 1.5 mm and 2.0 mm. The further curves B to D show a negative bending of the panel-like body 3 in the case of great distances from the adhesive periphery 5a. The results shown in FIG. 2 were obtained here by finite element methods, based on a shrinkage of the adhesive 5 of 3%. FIG. 2 consequently likewise demonstrates that there is a distance d at which the deformations (averaged over the entire panel-like body 2) are minimal. According to FIG. 2, this distance d should lie in the range between 0 mm and 0.5 mm.

Figure 3:
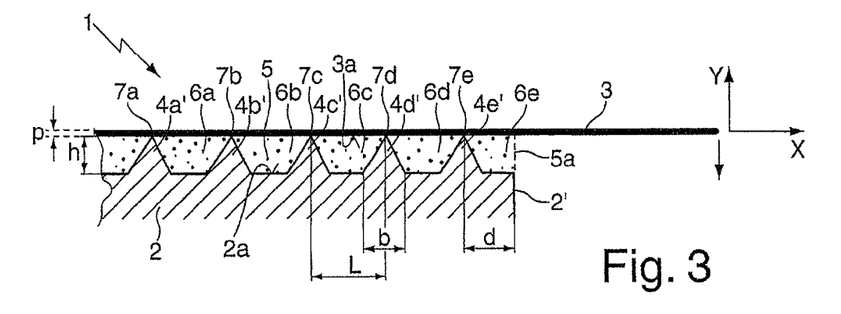
FIG. 3 shows a schematic representation of a composite body which comprises a solid body on which spacers are formed in the form of projections.

FIG. 3 shows the composite body 1 in a sectional representation analogous to FIGS. 1a,b, the distance d between the outermost spacer 4e and the adhesive periphery 5a being chosen such that the panel-shaped body 3 is not noticeably deformed even after the shrinking of the adhesive 5. In the case of the composite body from FIG. 3, by contrast with FIGS. 1a,b, the spacers are formed by projections 4a' to 4e' on the bonding surface 2a. The projections 4a' to 4e' may be formed on the bonding surface 2a by removal of material, by the (previously planar) bonding surface 2a being mechanically worked or etched away.

As can likewise be seen in FIG. 3, the spacers 4a' to 4e' are formed in section as triangles and arranged at a constant distance L in relation to one another, the distance L typically being over 0.3 mm, generally 1 mm or more. The width b of the spacers 4a' to 4e' is generally between 20 μm and 250 μm and may correspond substantially to the height h of the spacers 4a' to 4e'. The spacers 4a' to 4e' each narrow to a tip, which in each case forms a supporting location 7a to 7e for direct contacting with the bonding surface 3a. It goes without saying that the spacers 4a' to 4e' that are triangular in section may also be of a pyramidal or conical form and that other shapings are also possible for the spacers 4a' to 4e'.

In the case of the example from FIG. 3, the distance d lies in the range between 50 μm and 100 μm, typically between 60 μm and 80 μm. It has been possible in simulation calculations to confirm that distances d in this range of values lead to a small deformation when using customary adhesives 5 with which the shrinkage lies between 1% and 5%, generally between 2% and 4%, in particular between 2.5% and 3.5%.

The choice of the adhesive 5 depends on the type of materials of the bodies 2, 3 at the bonding surfaces 2a, 3a. Suitable adhesives 5 are, for example, 2-component adhesives, in particular epoxy adhesives, and 1-component adhesives, in particular UV-curable adhesives.

In particular when using a microstructured bonding surface 2a with projections 4a' to 4e' as spacers, it is favorable if the dynamic viscosity of the adhesive 5 that is used is less than 5000 mPa s, less than 3000 mPa s or less than 2500 mPa s, in order to ensure that the adhesive 5 is located substantially between the spacers 4a' to 4e' but not on the spacers 4a' to 4e', in particular not in the region of the supporting locations 7a to 7e. In this way, direct contacting of the bodies 2, 3 on the supporting locations 7a to 7e, and consequently a parallel alignment of the bodies 2, 3 at their bonding surfaces 2a, 3a, are made possible.

The deflection or bending of the panel-shaped body 3 from FIG. 3 is described below on the basis of FIGS. 6 to 9, in which the results of simulation calculations obtained with the aid of finite element methods are presented. The deflection (in μm in the negative Y direction) of the outer end of the panel-shaped body 3, which in the examples shown there has a distance from the adhesive periphery 5a (projecting length) of 20 mm, is represented respectively in dependence on the distance d between the adhesive periphery 5a and the outermost spacer 4e and the (constant) distance L between the spacers 4a' to 4e' and further spacers that are not represented.

The height h of the spacers 4a' to 4e' or of the adhesive gap in the case of all the representations shown in FIGS. 6 to 9 is 0.1 mm. The quotient between the modulus of elasticity of the panel-shaped body 3 and the modulus of elasticity of the adhesive 5 in the case of the representations shown is about 21.5 and a shrinkage of the adhesive 5 of 3% was taken as a basis.

Figure 6:
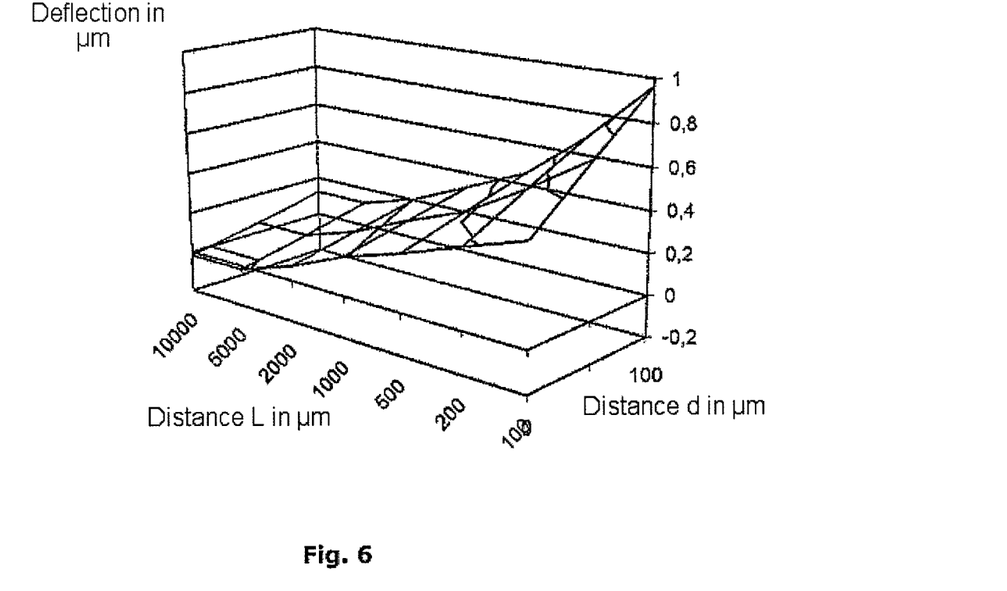
Figure 7:
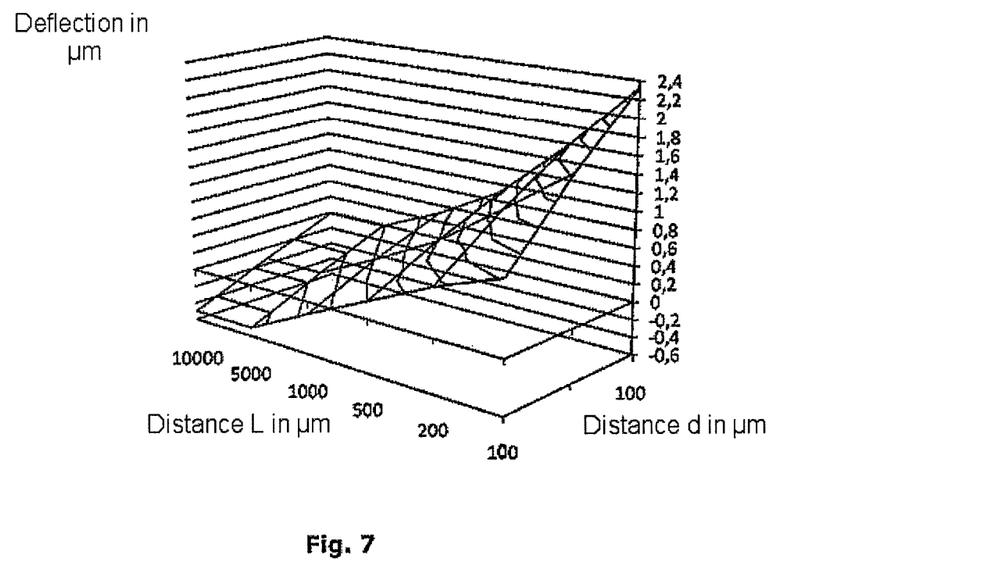
Figure 8:
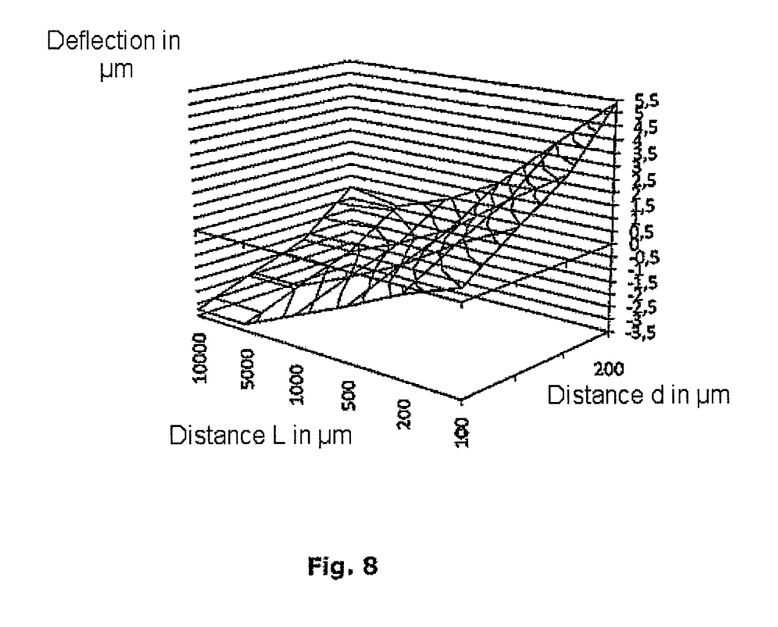
Figure 9:
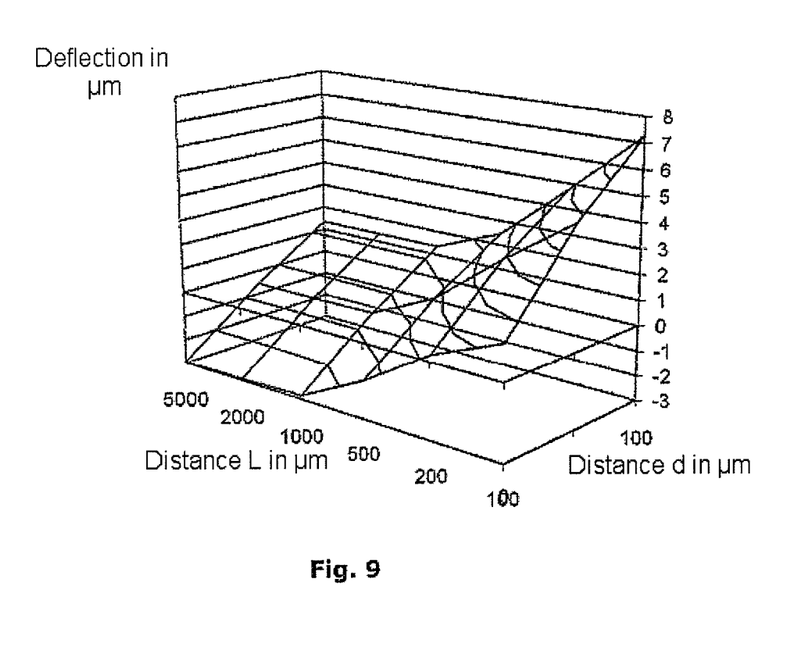

FIG. 6 shows the results of the simulation for a thickness P of the panel-shaped body of 1 mm and given a stiffness of the spacers 4a' to 4e' of about 10 000 N/mm. The parameters chosen for the results represented in FIG. 7 differ from those of FIG. 6 by the choice of a smaller thickness P of the panel-shaped body 3 of 0.5 mm. In the representation shown in FIG. 8, a thickness P of 0.5 mm was likewise chosen, but a stiffness of the spacers of about 30 000 N/mm was chosen. In FIG. 9, the stiffness of the spacers was again chosen as about 10 000 N/mm; however, the thickness P of the panel-shaped body 3 was in this case 0.2 mm.

When comparing the representations shown in FIG. 6 to FIG. 9, it is noticeable that negative deflections, i.e. deflections in the positive Y direction, increase with decreasing thickness P or increasing stiffness of the spacers $4a'$ to $4e'$. A complete absence of the deflection or bending of the bar-shaped body 3 can also only be achieved with relatively great distances L between the spacers $4a'$ to $4e'$, which are typically about 1 mm or more. Altogether, the representations of the deflection in FIG. 6 to FIG. 9 reveal that a suitable choice of the distance d between the adhesive periphery $5a$ and the outermost spacer $4e'$ that results in minimizing the deformations depends on a number of parameters, a suitable value typically lying between about 20 μm and about 250 μm. As already described in connection with FIGS. $1a,b$, the deflection in the negative Y direction decreases here with decreasing distance d.

The substantially bar-shaped body 3 from FIG. 3 projects only in one direction (the X direction) beyond the solid body 2. It goes without saying that it is of interest to check how the above results change if the panel-shaped body 3 projects not only in one direction but in two directions beyond the solid body 2. In order to determine exactly the distance d at which the deformations of the composite body 1 or of the panel-shaped body 3 become minimal in such a case, an experiment was carried out on a model composite body 1, such as that represented in FIG. 4. The first, solid body 2, of which the model composite body 1 consists, is a cuboidal body, which has been bonded with a circular panel 3 by adhesive bonding, using an epoxy resin adhesive that has a shrinkage of about 3%.

Figure 5:
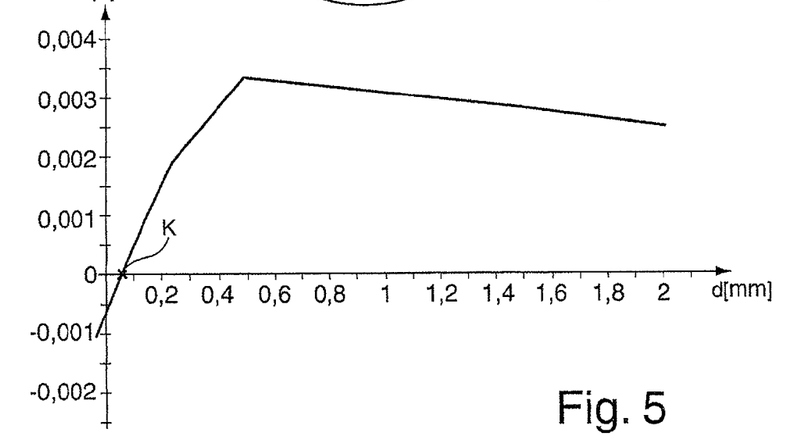
FIG. 5 shows a schematic representation of a roughness value (PV value) of the panel in dependence on the distance from the adhesive periphery of the composite body from FIG. 4, FIGS. 6-9 show representations of the deflection of the panel-shaped body according to FIG. 3 with different thicknesses or different stiffnesses of the spacers.

The roughness (as "peak-to-valley" value) of the composite body 1 or of the panel 3 after the shrinking of the adhesive was calculated by simulations. The results are represented in FIG. 5 and show the PV value in dependence on the distance d from the adhesive periphery $2'$ of the cuboidal body 2 over the entire radius of the panel 3. The distance d runs here from the edge $2'$ of the cuboidal body 2 inward, i.e. toward the center of the panel 3. The amount of the PV value is, by definition, a positive value. However, the X axis shown in FIG. 5 defines the PV value at which the changeover between peaks and valleys of the "peak-to-valley" value takes place, i.e. peaks and valleys are just switching their role for this PV value. The PV value at the changeover point, which has been chosen here as the X axis, fixes the minimum deformation of the panel-shaped body 3, so that the associated distance d from the edge $2'$ at the point K (at about 0.07 mm) fixes the optimum distance between the outermost spacer $4e$ and the adhesive periphery $5a$. It goes without saying that the optimum distance d was found here for an adhesive shrinkage of 3% and varies in dependence on the shrinkage of the adhesive that is used and further parameters.

Figure 4:
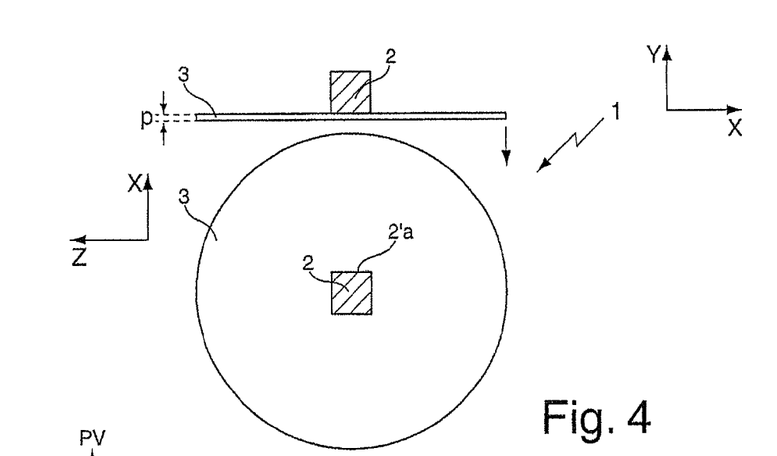
FIG. 4 shows a plan view and a side view of a cube which is adhesively attached on a circular panel.
Figure 10:
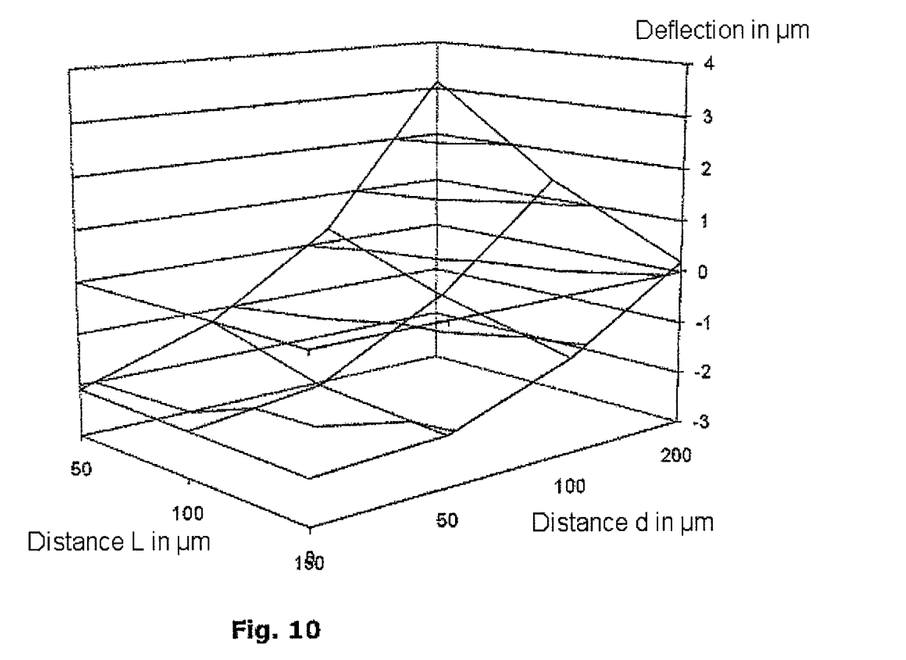
FIG. 10 shows a representation of the deflection of the circular panel according to FIG. 4.

The result of a simulation calculation of the bending or deflection of the circular panel-shaped body 3 from FIG. 4 is represented in FIG. 10. There, the deflection (in the negative Y direction) of the outer, free end of the circular body 3 is represented in dependence on the distance d of the outermost spacer (not shown in FIG. 4) from the respective adhesive periphery $2'$ and on the distance L of the spacers from one another. The spacers form here a two-dimensional grid in the plane of the panel (XZ plane), i.e. the representation of FIG. 3 corresponds in FIG. 4 both to a section in the X direction and to a section in the Z direction.

The thickness P of the panel-shaped body 3 in the simulation was 0.5 mm, the extent of the adhesive gap was 0.1 mm and the stiffness of the spacers was about 10 000 N/mm. The quotient between the modulus of elasticity of the panel-shaped body 3 and the modulus of elasticity of the adhesive was about 21.5. The diameter of the panel-shaped body 3 was 20 mm and the edge length of the cuboidal body 2 was 5 mm. It can clearly be seen that, in this case too, the deflection, and consequently the bending, of the panel-shaped body 3 depends significantly on the choice of the distance d between the edge $2'$ or the adhesive periphery and the outermost spacer.

In the examples described above, the composite body 1, represented as a detail, is formed as a positioning table, in particular as a wafer stage or as a reticle stage for microlithography. Such positioning tables are often used in projection exposure apparatus for microlithography (not shown), in which an inert gas atmosphere or possibly a vacuum prevails, so that, in addition to the curing of the adhesive, a drying out of the adhesive occurs. It goes without saying that the shrinkage value of the adhesive described here is understood as meaning the entire (maximum possible) shrinkage of the adhesive that is produced by curing and drying out of the adhesive.

In the case of a composite body 1 that is formed as a positioning table, the panel-like body 3 may be, for example, a wall region of the positioning table to which a solid fixture 3 is attached by adhesive bonding. The fixture 2 may be, for example, a sensor, a motor holder, etc., which is fixed to the wall region. Alternatively, it is of course also possible that the solid body 2 represents a partial region of the positioning table to which a fixture, for example in the form of a positioning scale, is attached. The positioning table is typically made up of more than two bodies, of which at least two are secured to each other in the way described above.

The above description has been given by way of example. From the disclosure given, those skilled in the art will not only understand the present invention and its attendant advantages, but will also find apparent various changes and modifications to the structures and methods disclosed. The applicant seeks, therefore, to cover all such changes and modifications as fall within the spirit and scope of the invention, as defined by the appended claims, and equivalents thereof.

The invention claimed is:

1. A composite body, comprising:
   a solid first body,
   a panel-shaped second body, which projects in at least one direction laterally beyond a lateral edge of the solid first body,
   an adhesive bonding the solid first body and the panel-shaped second body to each other at bonding surfaces of the solid first body and the panel-shaped second body, the bonding surfaces lying opposite each other,
   the solid first body and the panel-shaped second body being configured as parts of a microlithography positioning stage,
   wherein at least one of the bonding surfaces comprises a plurality of spacers arranged in the lateral direction, and the adhesive is applied both into intermediate spaces laterally between the spacers and laterally beyond an outermost spacer as far as a lateral adhesive periphery, which is formed at the lateral edge of the solid first body,
   wherein a distance in the lateral direction between the adhesive periphery and the outermost spacer is between 20 μm and 250 μm, to set a state of deformation of the panel-shaped second body that minimizes bending of the panel-shaped second body in directions perpendicular to the lateral direction after shrinkage of the applied adhesive, and wherein the spacers are formed as projections in one of the bonding surfaces, the one bonding surface being microstructured, and the projections have a maximum width in the lateral direction of less than 250 μm.

2. The composite body as claimed in claim 1, wherein the spacers are arranged at distances from one another of over 0.3 mm.

3. The composite body as claimed in claim 1, wherein the panel-shaped second body has a thickness no greater than 5 mm.

4. The composite body as claimed in claim 1, wherein a quotient of a modulus of elasticity of the panel-shaped second body and a modulus of elasticity of the adhesive lies between 5 and 300.

5. The composite body as claimed in claim 1, wherein the bonding surface of one of the bodies is a planar surface.

6. The composite body as claimed in claim 1, wherein the adhesive has a shrinkage of between 0.1% and 5%.

7. The composite body as claimed in claim 1, wherein the adhesive has a dynamic viscosity of less than 5000 mPa s.

8. The composite body as claimed in claim 1, wherein the adhesive is a 2-component adhesive or a 1-component adhesive.

9. The composite body as claimed in claim 1, wherein the microlithography positioning stage is a wafer stage or a reticle stage.

10. The composite body as claimed in claim 1, wherein the adhesive is applied exclusively into the intermediate spaces laterally between the spacers and laterally beyond an outermost spacer as far as the lateral adhesive periphery, without being applied onto contact surfaces of the spacers.

11. The composite body as claimed in claim 1, wherein the spacers are formed on the solid first body, and have contact portions which contact the panel-shaped second body.

* * * * *

UNITED STATES PATENT AND TRADEMARK OFFICE
CERTIFICATE OF CORRECTION

| | | |
|---|---|---|
| PATENT NO. | : 8,927,090 B2 | Page 1 of 1 |
| APPLICATION NO. | : 13/248987 | |
| DATED | : January 6, 2015 | |
| INVENTOR(S) | : Hin Yiu Anthony Chung et al. | |

It is certified that error appears in the above-identified patent and that said Letters Patent is hereby corrected as shown below:

In the Specification:
Column 4; Line 6; change "hardered" to -- hardened --.

Signed and Sealed this
Tenth Day of May, 2016

Michelle K. Lee
*Director of the United States Patent and Trademark Office*